United States Patent
Han et al.

(10) Patent No.: US 6,529,410 B1
(45) Date of Patent: Mar. 4, 2003

(54) NAND ARRAY STRUCTURE AND METHOD WITH BURIED LAYER

(75) Inventors: Michael Han, San Jose, CA (US); Narbeh Derhacobian, Belmont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/665,916

(22) Filed: Sep. 20, 2000

(51) Int. Cl.[7] .................................................. G11C 16/04
(52) U.S. Cl. ............................ 365/185.17; 365/185.18; 365/185.28; 257/347
(58) Field of Search ........................ 365/185.17, 185.18, 365/185.28, 185.01; 257/347

(56) References Cited

U.S. PATENT DOCUMENTS

| | | | | |
|---|---|---|---|---|
| 5,541,875 A | * | 7/1996 | Liu et al. | 257/377 |
| 5,586,073 A | * | 12/1996 | Hiura et al. | 365/185.01 |
| 5,930,642 A | * | 7/1999 | Moore et al. | 257/347 |
| 6,163,048 A | * | 12/2000 | Hirose et al. | 257/135 |
| 6,188,606 B1 | * | 2/2001 | Derhacobian et al. | 365/185.17 |
| 6,188,611 B1 | * | 2/2001 | Endoh et al. | 365/185.24 |

* cited by examiner

*Primary Examiner*—Hoai Ho
(74) *Attorney, Agent, or Firm*—Skjerven Morrill LLP (57) ABSTRACT

An efficient NAND array structure includes memory cells coupled in series between a bit-line and a select source transistor, without a select drain transistor. The memory cells each include a floating gate transistor, having a control gate connected to a word-line, which selects the memory cell during its programming. In one embodiment, the NAND array structure includes a buried layer at a junction between the substrate and a well in which the memory cells are formed. Programming is achieved using hot electron injection. In one embodiment, multiple memory cells are programmed simultaneously.

14 Claims, 9 Drawing Sheets

NAND ARRAY STRUCTURE AND METHOD WITH BURIED LAYER

BACKGROUND OF THE INVENTION

1. Field of the Invention

The present invention relates to non-volatile memories. More specifically, the present invention relates to a non-volatile NAND array memory cell structure and a method of manufacturing such memory cell structure.

2. Discussion of the Related Art

A memory cell of a non-volatile memory device, such as electrically programmable read-only memory (EPROM) and electrically-erasable programmable read-only memory (EEPROMs), has an electrically isolated gate, referred to as a floating gate, on which data is stored in the form of electrical charge. Charge is transported to or removed from the floating gate by program and erase operations.

One type of non-volatile memory allows erasure and reprogramming inside a system, without requiring an additional external power supply. Flash memory devices are typically lower in cost and available in higher densities than conventional EEPROM. As a result, flash memory is well-suited to a number of end-product applications, including existing embedded-system flash applications as personal computers and peripherals, solid state disks, telecommunication switches, cellular phones, and internetworking, instrumentation and automotive devices, and emerging consumer-oriented voice, image and data storage products such as digital still cameras, digital voice recorders, and personal digital assistants (PDAs). A flash memory structure typically consists either NOR or NAND memory cell blocks, depending on the specific application.

In a typical layout of a flash memory, the memory cell blocks contain memory cells arranged in a common region which is referred to as the "core" area of the chip. Other components necessary for operating the flash memory devices, such as block select transistors, charge pumps, etc. are located at the peripheral areas of the chip. In each block, block select transistors select the core floating gate transistors to be operated upon, and typically consist of a select drain transistor and a select source transistor.

Figure 1:
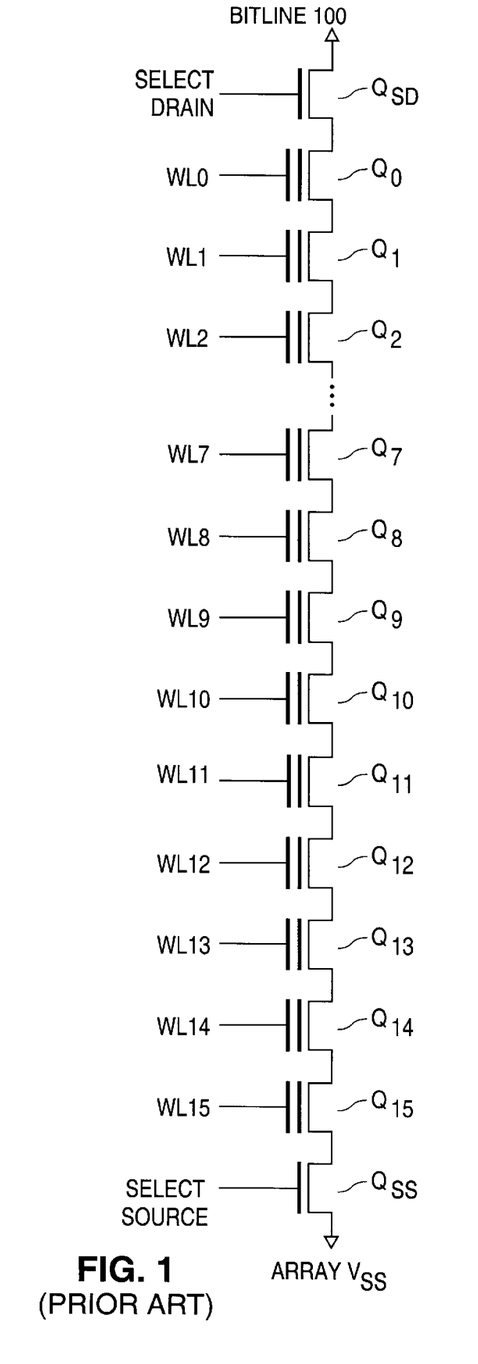
FIG. 1 shows a string comprising two block select transistors and sixteen memory cells coupled in series between the two block select transistors.

FIG. 1 shows a conventional NAND array block which has a series of floating gate transistors $Q_0$ through $Q_{15}$ coupled in series between a select drain transistor $Q_{SD}$ and a select source transistor $Q_{SS}$. Select drain transistor $Q_{SD}$ is coupled to bit-line 100 and select source transistor $Q_{SS}$ is coupled to an array voltage source providing select source voltage $V_{SS}$. Select drain transistor $Q_{SD}$ selects or deselects bit-line 100 during programming. Each of floating gate transistors $Q_0$ through $Q_{15}$ is a memory cell that is programmed and erased using Fowler-Nordheim tunneling. Each float gate transistor has a control gate connected to a respective word-line (e.g., word-line $WL_0$ through $WL_{15}$) and which is In Fowler-Nordheim tunneling programming, electrons are induced into a floating gate of a selected memory cell (e.g., memory cell $Q_0$) by first turning select source transistor $Q_{SS}$ and select drain transistor $Q_{SD}$ off to isolate the memory cells (i.e., memory cells $Q_0$ through $Q_{15}$), biasing the control gate of the selected memory cell at a relatively high voltage of approximately 18–20 volts, and grounding the body region of the selected memory cell. The high voltage on the control gate of the selected memory cell induces electrons from the body region (i.e., the substrate) to tunnel through the lower tunnel oxide layer and into the floating gate. When the floating gate accumulates negative charges, the threshold voltage of the selected memory cell is increased.

In Fowler-Nordheim tunneling erasing, the substrate is biased at approximately 18–20 volts while the control gate is grounded, thus driving the electrons from the floating gate back into the substrate. While programming is typically performed individually to each memory cell, erasing is typically performed to a block of memory cells.

Reprogramming is typically accomplished by block erasure and then programming individual selected memory cells.

The above described Fowler-Nordheim tunneling technique has several drawbacks. For example, two block select transistors are required per string, taking up premium space on the chip. In addition, the conventional memory cell structure described above requires on-chip generation and handling of the 18–20 volts programming voltages. Circuits handling such high voltages are more complex and larger than circuits for lower voltage applications. Furthermore, only one memory cell in each string can be programmed at any time.

The high voltage applied to the word-line during programming has an additional disadvantage. That is, during a write operation to a selected memory cell, the high bit-line and word-line voltages for the selected memory cell can create a large voltage difference between the floating gate and the drain terminal of a nearby unselected memory cell. The large voltage difference induces Fowler-Nordheim tunneling that disturbs the threshold voltages of the unselected memory cell by causing electrons to tunnel out of the floating gate to the drain terminal. This unintended consequence is known in the industry as "program disturb."

Program disturb is undesirable because the charge in the drain terminal of an unselected memory cell in the string accumulates each time a different selected memory cell is programmed, so that, after a few write operations, an unselected memory cell may have accumulated enough charge to become a programmed memory cell. In the prior art, an unselected word-line is boosted to the selected line potential ("self-boosting") to diminish the effective voltage across the memory cell. However, to provide self-boosting, additional circuitry is required, adding to cost and device area.

Figure 2:
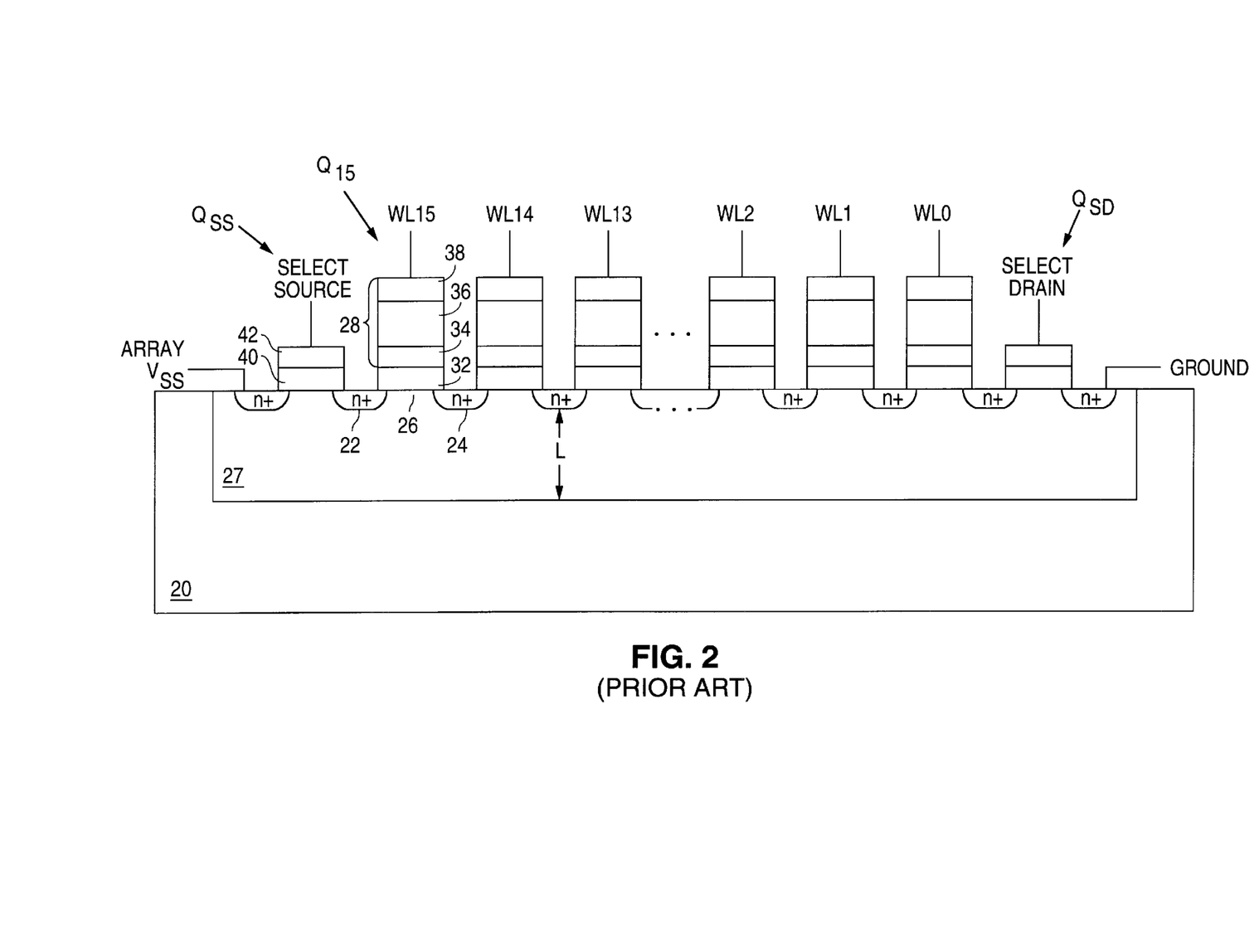
FIG. 2 shows a cross-sectional view of a string comprising two select transistors and sixteen memory cells coupled in series.

FIG. 2 shows a cross-sectional view of a NAND string. Typically, each memory cell (e.g., floating gate transistor $Q_{15}$) includes source region 22, drain region 24, channel region 26 and stacked gate structure 28, which is formed separated from channel region 26 by dielectric layer 32. As shown in FIG. 2, within the string, source region 22 is shared as drain region 24 by an adjacent memory cell. In FIG. 2, source region 22 and drain region 24 are N+ type high impurity concentration regions, channel region 26 is a P-type region, and substrate 20 is an N-type substrate.

Stacked gate structure 28 typically includes floating gate 34, formed by a first polysilicon layer (poly I), and control gate 38, formed by a second polysilicon layer (poly II). Floating gate 34 is isolated from control gate 38 by dielectric layer 36 and from channel region 26 by thin dielectric layer 32, which is typically approximately 100 Å (Angstrom) thick. Thin dielectric layer 32 is commonly referred to as the tunnel oxide. Dielectric layer 36 is often a multilayer insulator such as an oxide-nitride-oxide (ONO) stack. Select source transistor $Q_{SS}$ and select drain transistor $Q_{SD}$ do not have a stacked gate structure.

The principal electrical measurement of a floating gate transistor, called the "beta" measurement, measures the amplification characteristic of the floating gate transistor. Beta is the ratio of the source-drain current to the gate current. For example, a 1-mA (milliampere) gate current and a 10-mA source current correspond to a beta of 10. Beta is determined by junction depths, junction separation (base width L), doping levels, concentration profiles, and other process and design factors. A beta in the range of 20 to 50 is typically desirable.

SUMMARY OF THE INVENTION

The present invention provides a NAND array structure and a method for manufacturing such an array structure that is compact and substantially free of program disturbs.

According to one embodiment of the present invention, a NAND array structure programmable by hot electron injection is provided. In one embodiment, the NAND array structure includes a buried layer formed at a junction between the substrate and a well. The buried layer can be achieved by implanting antimony into a substrate layer, and thereafter, growing an epitaxial layer over the implanted substrate layer. A well is then formed in the epitaxial layer.

A first dielectric layer is then formed over the substrate. A stacked gate structure is then formed over the first dielectric layer. In one embodiment, the stacked gate structure includes a floating gate over the first dielectric layer, a second dielectric layer above the floating gate, and a control gate. In one embodiment, over the control gate is provided, in order, a tungsten-silicide layer, a polysilicon cap and a silicon oxynitride layer.

In one embodiment, a single select source transistor per string is provided for string selection. In that embodiment, the gate structure of the select source transistor is formed from the same layer that formed the floating gate of the memory cells.

In one embodiment, the memory cell is programmed by applying a first voltage (e.g., approximately 4–5 volts) to the bit-line, a second voltage (e.g., ground) to the select source transistor, a third voltage (e.g., approximately 6–10 volts) to a selected word-line and a fourth voltage (e.g., approximately 0–2 volts) to an unselected word-line. In one embodiment, the difference between the third voltage and the fourth voltage is greater than the memory cell's threshold voltage which, in that embodiment, is approximately 2–3 volts. Prior to programming, all the cells are placed in a known state by block erasure.

The present invention is better understood upon consideration of the detailed description below and the accompanying drawings.

BRIEF DESCRIPTION OF THE DRAWINGS

The use of the same reference symbols in different drawings indicates similar or identical items.

DETAILED DESCRIPTION

The present invention provides in one embodiment a NAND array structure and a manufacturing process for such a structure. The NAND array of the present invention achieves high efficiency and small footprint by eliminating a block select transistor, reducing programming voltages, and forming a buried layer at the a PN junction.

Figure 3:
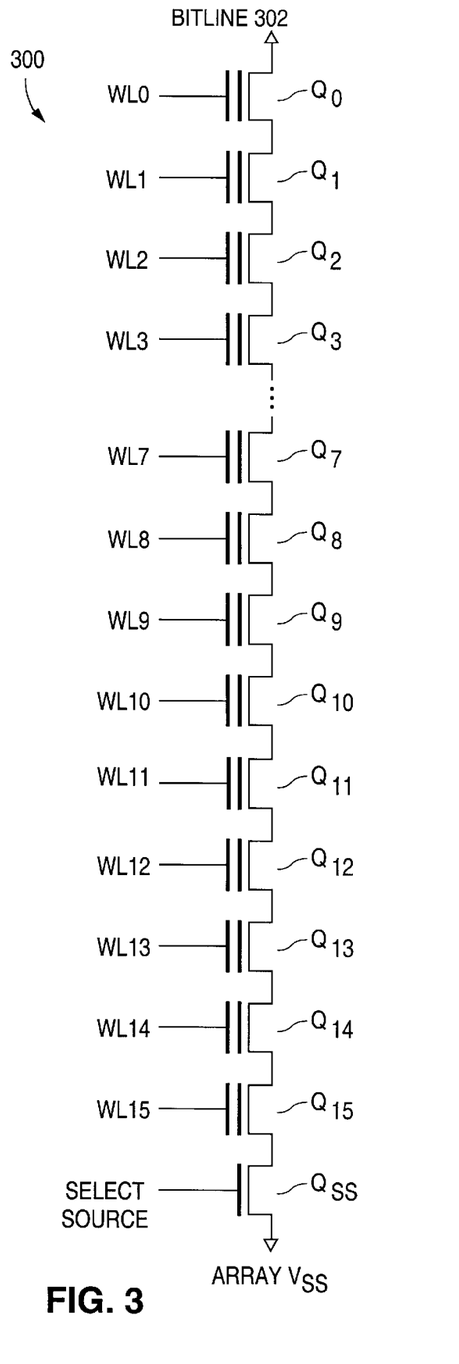
FIG. 3 shows a string comprising a select source transistor coupled to sixteen memory cells in series in accordance with the present invention.

FIG. 3 shows string 300 including floating gate transistors (i.e., memory cells) labeled $Q_0$ through $Q_{15}$ coupled in series to a select source transistor $Q_{SS}$. Memory cells $Q_0$ through $Q_{15}$ are coupled between bit-line 302 and an array voltage source $V_{SS}$ (through transistor $Q_{SS}$), which can be an external supply voltage source, such as ground. The control gate of each of memory cells $Q_0$ through $Q_{15}$ is coupled to a respective one of word-lines $WL_0$ through $WL_{15}$, which can be output signals of a memory address decoder (not shown). Unlike prior art NAND array structures, string 300 does not include a select drain transistor.

In string 300, to select a memory cell, a select source voltage $V_{SS}$ of approximately 4–5 volts is applied to select source transistor $Q_{SS}$, and the word-line for the selected memory cell is applied a voltage of approximately 6–10 volts. A voltage of 0–2 volts is applied to the word-lines of the unselected memory cells. Select source voltage $V_{SS}$ is chosen based on an energy barrier at the $SiO_2$—Si barrier at the substrate-tunnel tunnel oxide interface in a memory cell. This energy difference is approximately 3.1 eV (electron-volts). The energy barrier represents the energy required for an electron to pass through the tunnel oxide from the substrate to the floating gate.

Figures 4, 5:
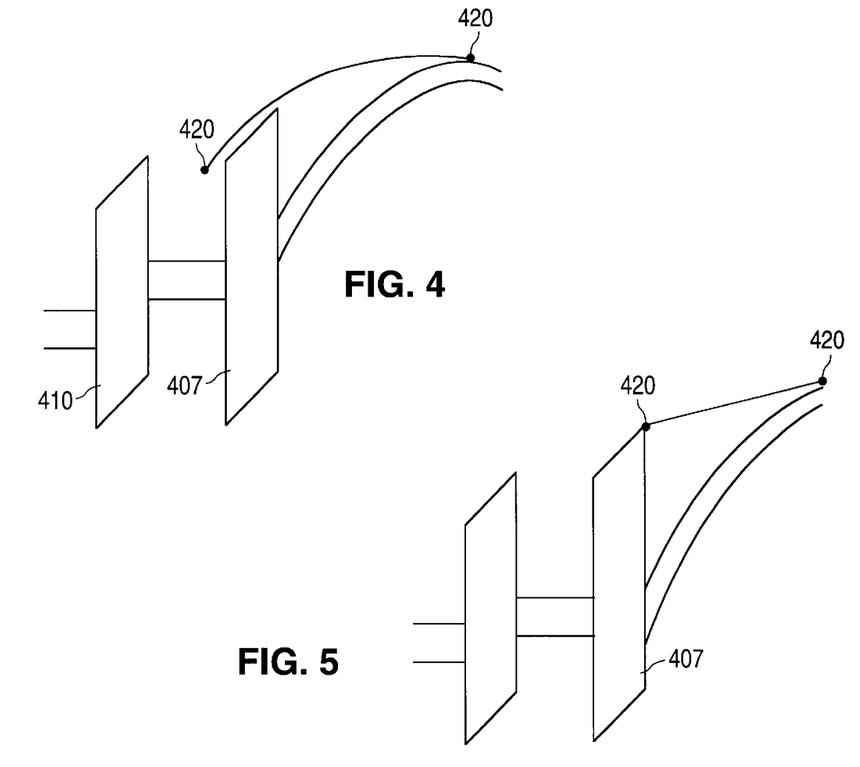
FIG. 4 is an energy band diagram illustrating programming of a memory cell.
FIG. 5 is an energy band diagram illustrating inhibiting a memory cell.

According to the present invention, hot electron injection technique is used to program a memory cell. Hot electron injection results from an accelerating potential built up in the substrate. When an electron having an energy greater than the energy barrier (i.e., 3.1 eV for silicon), the electron passes into the floating gate. One method to provide hot electron injection is by having a forward-biased PN junction in the well. Electron injection can be achieved by applying, for example, a 4–5 volt bit-line voltage which is greater than the barrier height difference (e.g., 3.1 eV). The electric field thus created accelerates the electrons to a sufficient energy to reach the floating gate of the memory cell. FIG. 4 is an energy band diagram illustrating programming a memory cell where electron 420 has gained enough energy to fall between dielectric layer 410 (e.g., ONO layer) and floating gate 407. In contrast, FIG. 5 is an energy band diagram illustrating inhibiting a memory cell, where electron 420 does not have enough energy to go through the oxide layer and to reach floating gate 407.

Figure 6:
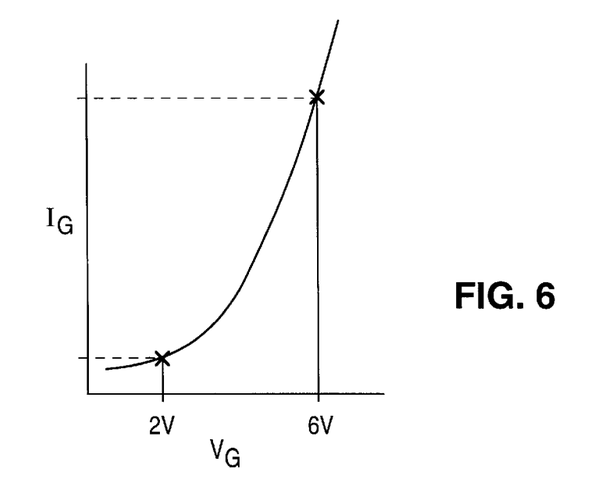
FIG. 6 shows a log-scale plot of a gate current versus a gate voltage.

The selected word-line voltage at the control gate of a selected memory cell enhances the programming current (i.e., the electron flow between the substrate and the floating gate). FIG. 6 shows hot electron injection current $I_G$ into the floating gate, as a function of the voltage $V_G$. As shown in FIG. 6, at the selected memory cell, where a 6-volt voltage is applied to the control gate in this instance, the hot electron gate current is much greater than the corresponding current in a non-selected memory cell, where a 2-volt gate voltage is applied to the control gate. Typically, the unselected word-line voltage and the selected word-line voltage are applied at the same time. The difference between the selected word-line voltage and the unselected word-line voltage is preferably greater than the threshold voltage of the memory cell, or approximately 2–3 volts in this embodiment.

Figure 7:
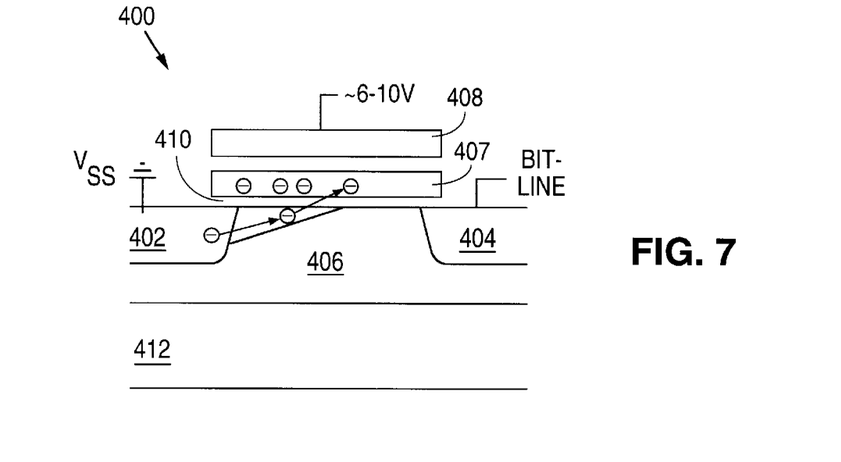
FIG. 7 shows the cell bias conditions during a program operation of a memory cell.

FIG. 7 shows the cell bias conditions during a programming operation of memory cell 400, which includes source region 402, drain region 404 and channel region 406. A high drain-to-source bias voltage of approximately 4–5 volts is applied at the bit-line, along with a relatively high voltage of approximately 6–10 volts at control gate 408. The control gate voltage inverts channel region 406, while the drain bias accelerates electrons from source region 402 towards drain region 404. In channel region 406, collisions with the silicon lattice re-directs under the gate field some electrons towards the interface between the substrate 412 412 and floating gate 407 of memory cell 412. Electrons that have sufficient energy to surmount the substrate-floating gate barrier of tunnel oxide 410 reach floating gate 407. In general, the various voltages (i.e., the bit-line voltage, the selected word-line voltage, the unselected word-line voltage and the select source voltage) must be applied such that the voltage at the selected word-lines invert all other unselected memory cells. In other words, the difference between the unselected word-line voltage and the selected word-line voltage must be greater than the threshold voltage $V_t$ of the selected memory cell, which is typically 2–3 volts in the current implementation. For example, if the unselected word-line is applied 4–6 volts, then the selected word-line voltage would be increased correspondingly, for example, to 8–12 volts.

Unlike in the prior art where the memory cell must be isolated for programming, under the present invention, one or more memory cells can be programmed simultaneously by activating the appropriate word lines. In addition, because a select drain transistor is unnecessary under the present invention, the size of each string is reduced. Since programming by hot electron requires a smaller supply voltage than that required to generate the programming voltages in the prior art, the chip surface area dedicated to related circuitry, such as charge pumps, are significantly smaller under the present invention. Furthermore, the program disturb problem is substantially eliminated because Fowler-Nordheim tunneling, which requires a high voltage of approximately 18–20 volts, is not used.

Figure 8:
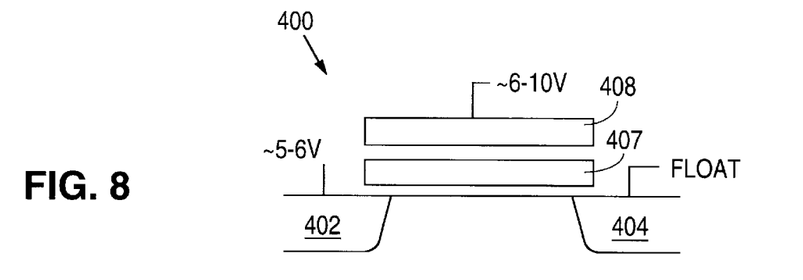
FIG. 8 shows the cell bias condition during an erase operation of a memory cell.
Figure 9:
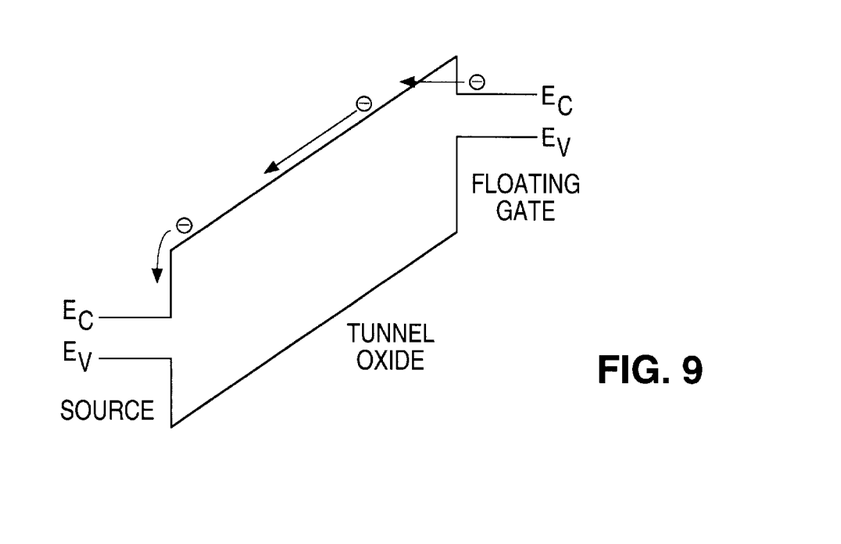
FIG. 9 shows an energy band diagram illustrating an erase operation.

Electrical erase of a memory cell can still be achieved using the quantum-mechanical effect of Fowler-Nordheim tunneling, which is illustrated by the bias conditions shown in FIG. 8. During erasure, drain region 404 is left floating. Approximately 5–6 volts are applied to source region 402, and 6–10 volts are applied to gate 408. Under these conditions, a high field (8–10 mV/cm) is present between floating gate 407 and source region 402. As evident by the energy band diagram of FIG. 9, electrons tunneling through tunnel oxide 410 are swept into source region 402. After erasure, electrons having been removed from the floating gate, the memory cell's threshold voltage is also reduced.

Figure 10:
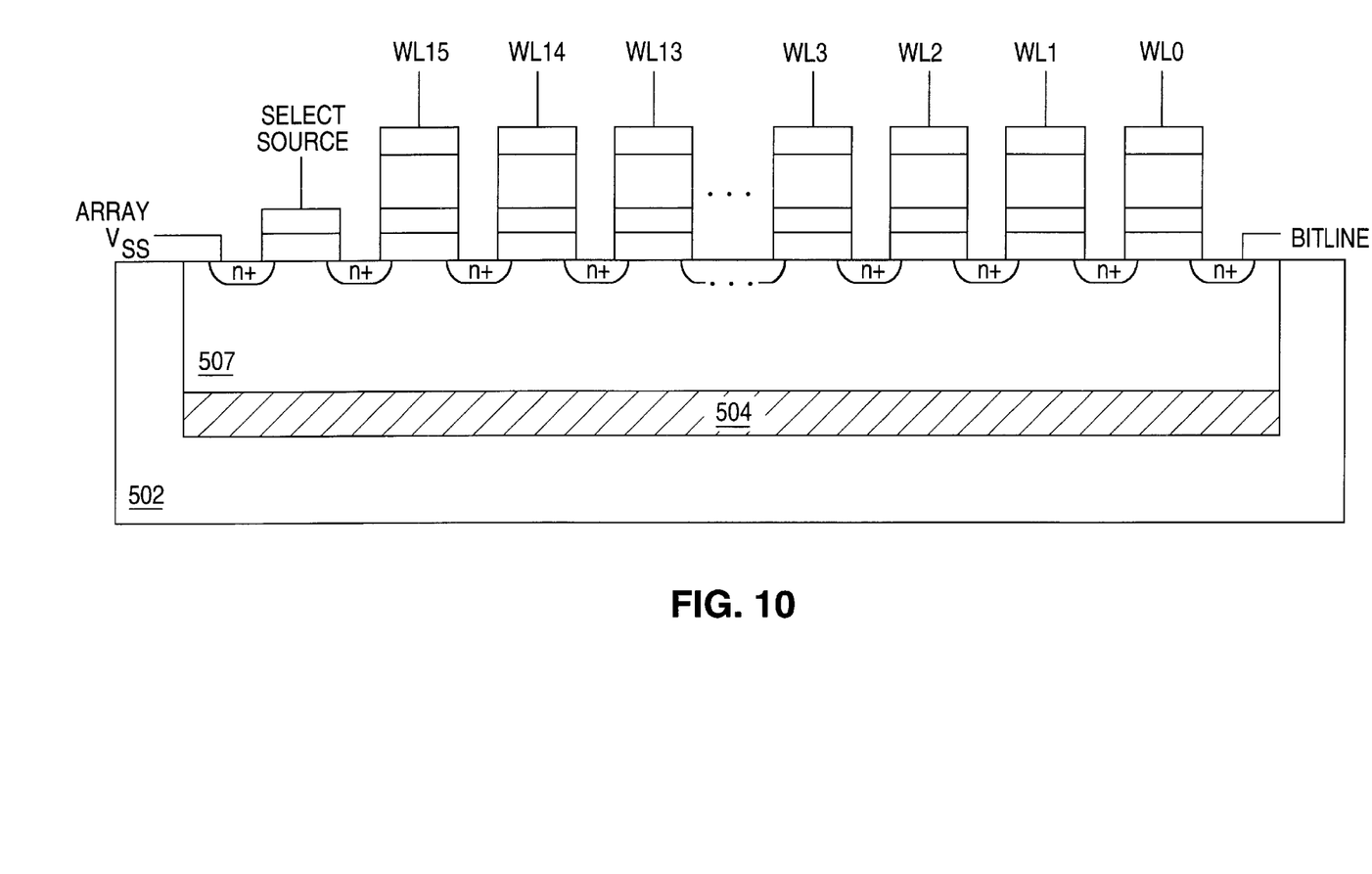
FIG. 10 shows a cross-section of the structure shown in FIG. 3.

FIG. 10 shows a cross section of the structure shown in FIG. 3. The string includes sixteen memory cells of which the control gates are connected to respective word-lines $WL_0$ through $WL_{15}$. Each memory cell has a source region, a drain region and a channel region in P-type well 507, in N-type substrate 502. Between substrate 502 and well 507 is N+ buried layer 504. The memory cells are coupled in series between a bit line and a select source transistor that is connected to an array voltage source.

Figure 11:
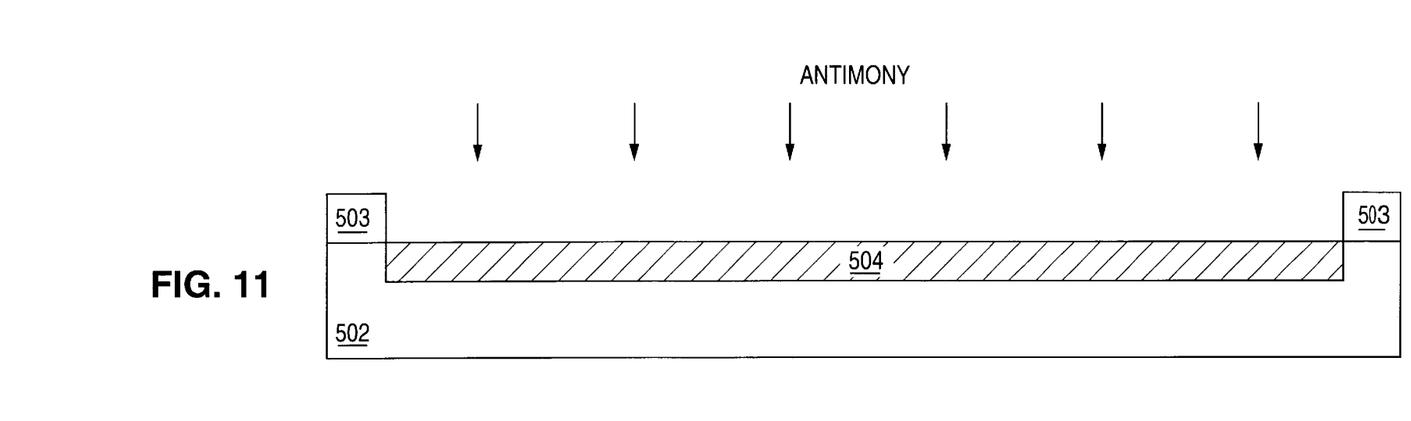
FIG. 11 through FIG. 16 show the process steps in a manufacturing process for forming a NAND array structure.

FIGS. 11 through 16 show the process steps for forming a NAND array structure of the present invention, such as that of FIG. 10. Initially, as shown in FIG. 11, mask 503 is formed over N-type semiconductor substrate 502 (e.g., silicon), using conventional lithography. Antimony is then implanted to form N+ layer 504 to an approximate concentration of $10^{19}$ atoms/cm$^3$. A conventional anneal step can be performed subsequently to remove implant defects and to diffuse the antimony into substrate 502. Mask 503 is then removed.

Figure 12:
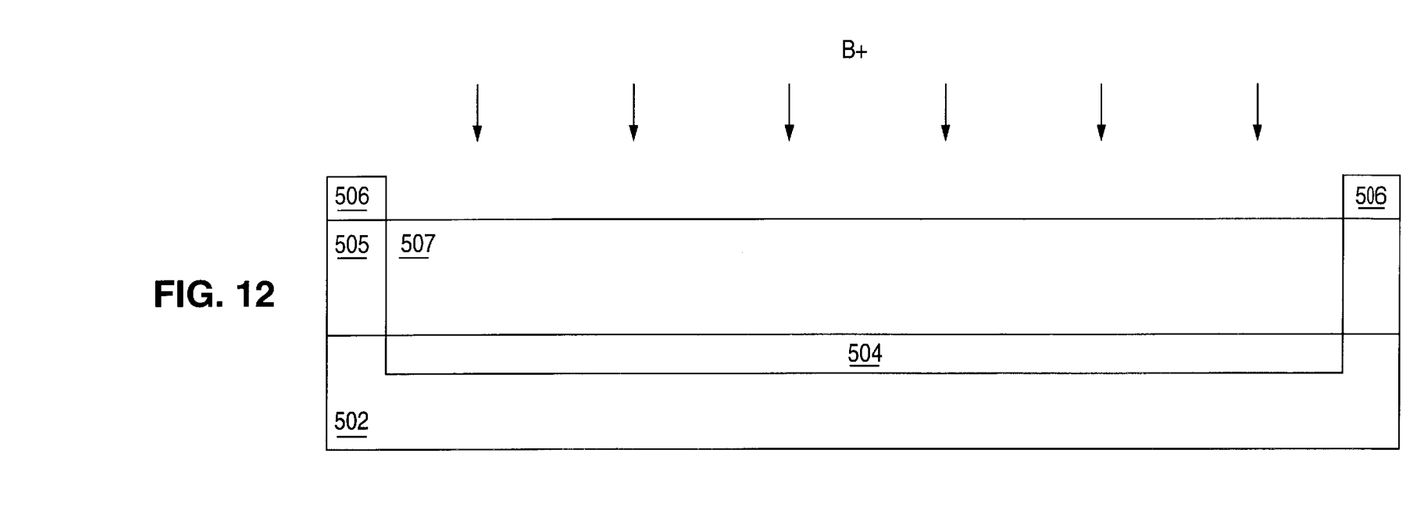

As shown in FIG. 12, an epitaxial silicon layer is then formed over substrate 502 up to, for example, one micron thick. Oxide isolation regions 505 are formed on an N-type semiconductor substrate 502 (e.g., silicon) to provide device isolation between the strings of the core array to be subsequently formed. Oxide isolation regions 505 can be formed using conventional local oxidation of silicon (LOCOS) techniques, or shallow trench isolation techniques. As N+ layer 504 is below epitaxial silicon layer 507, N+ layer 504 is also referred to as N+ buried layer 504. Boron (B+) is then implanted at approximately $10^{16}$–$10^{17}$ atoms/cm$^3$ to form P-well region 507. Mask 506 can be provided for the boron implantation.

Figure 13:
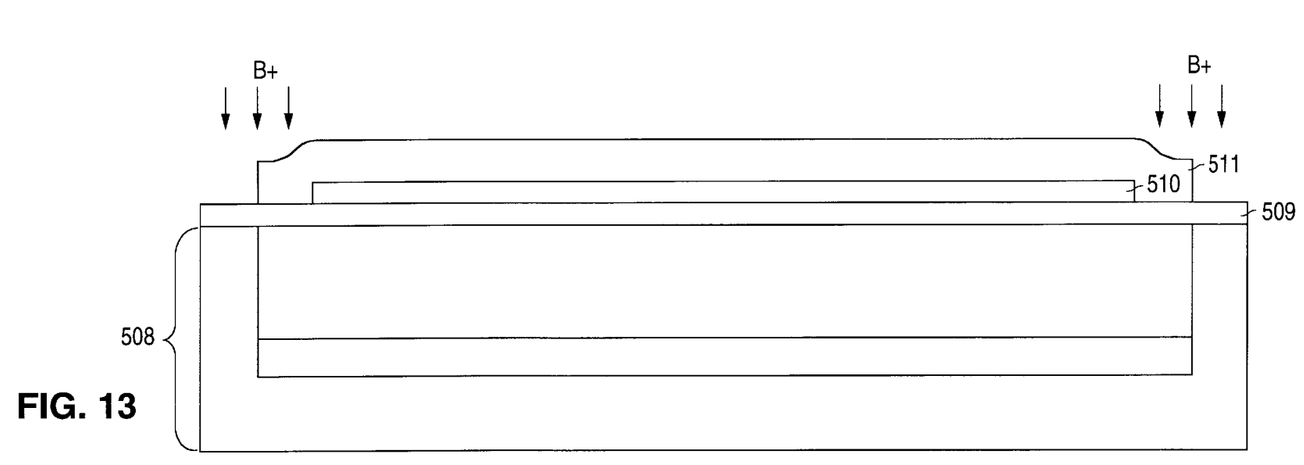

Referring to FIG. 13, tunnel oxide layer 509 is formed over substrate 508 using a thermal growth process in a dry oxidation furnace. For example, tunnel oxide layer 509 can be formed via dry oxidation at a temperature of approximately 1050° C., and oxygen ($O_2$), hydrogen chloride (HCl), and argon (Ar) of approximately 1.33 liters (l), 70 cc, and 12.6 liters, respectively. Alternatively, tunnel oxide layer 509 may be formed from silicon oxynitride (SiON). Tunnel oxide layer 509 has a thickness between approximately 50 Å (angstroms)–150 Å (typically, 87 Å–92 Å).

In one embodiment, polysilicon layer 510 is formed over tunnel oxide layer 509 to a thickness of approximately 800 Å–1000 Å. To form polysilicon layer 510, amorphous silicon can be deposited using a low pressure chemical vapor deposition (LPCVD), for example, at a temperature between approximately 450°–590° C. and a pressure between approximately 300 mT (milliTorr)–500 mT. The amorphous silicon can then be doped, for example, to approximately $5 \times 10^{18}$–$2 \times 10^{20}$ atoms/cm$^3$. Alternatively, polysilicon layer 510 is doped in situ using, for example, an LPCVD process containing a mixture of a silicon-containing gas (e.g., silane ($SiH_4$), at a flow rate of approximately 1,500–2500 sccm), a phosphorous-containing gas (e.g., phosphene, at approximately 10–30 sccm), and an inert carrier gas (e.g., nitrogen, helium, neon, argon, krypton or xenon). In one phosphorous-containing gas, phosphorus of approximately 0.9%–1.1% by weight is used.

Mask 511 is then formed over polysilicon layer 510 to define a core channel stop region using conventional photolithography techniques. Polysilicon layer 510 is then etched at, for example, a pressure of 125 mT, in a Chlorine ($Cl_2$) and hydrogen bromide (HBr) mixture. Core channel stop implant is then carried out by implanting boron (B+) at, for example, a dose of approximately $1.75 \times 10^{13}$ atoms/cm$^3$ at 65 KeV. Mask 511 is then removed.

Figure 14:
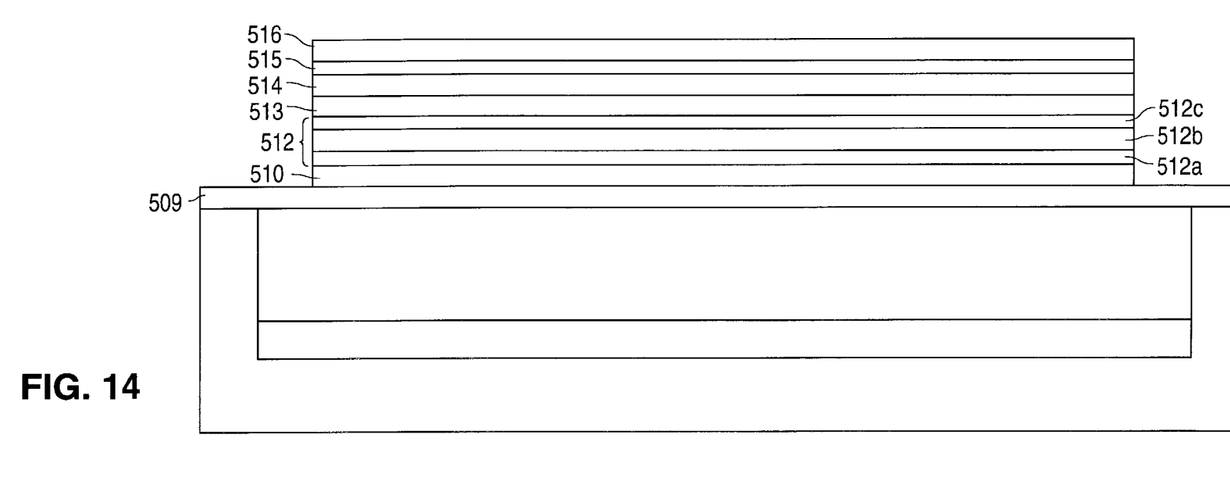

As shown in FIG. 14, dielectric layer 512 is then formed over amorphous silicon layer 510. Dielectric layer 512, which is typically multi-layered, is referred to as an "inter-poly" dielectric, as it is formed between polysilicon layer 510 (that forms the floating gates of memory cells) and a later formed polysilicon layer (that forms the control gates of memory cells). In one embodiment, dielectric layer 512 is formed as an oxide-nitride-oxide (ONO) stack that is approximately 120 Å–400 Å thick (typically, 130 Å).

To form an ONO stack, bottom oxide layer 512a of dielectric layer 512 is deposited using chemical vapor deposition (CVD) techniques, such as oxide deposition to 40 Å–60 Å at 750° C. in 20 sccm of silane ($SiH_4$), 1.2 liters per minute of nitrous oxide ($N_2O$), and a carrier gas. Pressure can be maintained at, for example, approximately 600 mT. Nitride layer 512b is next deposited using CVD techniques, for example, at a temperature of 760° C. under approximately 600 sccm of ammonia ($NH_3$) and 100 sccm of dichlorosilane ($SiH_2Cl_2$) at a pressure of approximately 330 mT, to approximately 60 Å–100 Å (typically, 80 Å).

Top oxide layer 512c is formed in a similar manner as oxide layer 512a or alternatively, by wet oxidation at approximately 950° C. for approximately 40 minutes using 5 liters of oxygen ($O_2$) and 9 liters of hydrogen ($H_2$) to a thickness of approximately 40 Å.

An ONO mask (not shown) is then formed over the structure to define the area of periphery gate oxidation, using conventional photolithography. Dielectric layer 512 and polysilicon layer 510 are then etched away in the peripheral gate areas. Dielectric layer 512 is removed first via a selective etch, e.g., reactive ion etching (RIE) at approximately 50 mT, using, for example, 85 sccm carbon tetrafluoride ($CF_4$), 15 sccm fluorinated hydrocarbon ($CHF_3$) and 10 sccm of oxygen ($O_2$). Polysilicon layer 510 is then etched under, for example, a pressure of approximately 60 mT in a mixture of 30 sccm of sulfur hexafluoride ($SF_6$) and 10 sccm of hydrogen bromide (HBr).

A mask (not shown) is then deposited and patterned to defined a first threshold voltage ($V_t$) implant region. Gate oxidation is carried out using, for example, wet oxidation at a temperature of approximately 800° C., under 6.4 liters of oxygen ($O_2$), 2.133 liters of hydrogen ($H_2$) and 75 cc of hydrochloride (HCl). The structure is then annealed at approximately 900° C. for approximately 20 minutes in approximately 12 liters of nitrogen ($N_2$). A first threshold voltage implant is carried out using boron (B+) at an energy of approximately $1.1 \times 10^{12}$–$1.1 \times 10^{15}$ KeV. The first threshold voltage implant mask is then removed.

A second mask (not shown) is deposited and pattered to define a second threshold voltage implant region. The second threshold voltage implant is carried out using boron (B+) at an energy of approximately $1.4 \times 10^{12}$–$1.4 \times 10^{15}$ KeV. The second threshold voltage implant mask is then removed.

A second gate oxidation is then performed using, for example, wet oxidation at a temperature of approximately 800° C., under 6.4 liters of oxygen ($O_2$), 2.133 liters of hydrogen ($H_2$) and 75 cc of hydrochloride (HCl). The structure is then annealed at approximately 900° C. for approximately 20 minutes in 12 liters of nitrogen ($N_2$).

Polysilicon layer 513 of approximately 1200 Å is then formed over dielectric layer 512 using, for example, a CVD technique at approximately 530° C., 400 mT pressure, 2000 sccm of silane ($SiH_4$), and a mixture of approximately 1% (by weight) phosphene ($PH_3$) in 75 sccm of helium (He). Alternatively, polysilicon layer 513 can be deposited by LPCVD, followed by an ion implantation of a dopant such as phosphorus. Polysilicon layer 513 forms the control gates of the memory cells.

A tungsten-silicide (WSix) layer 514 of approximately 1500 Å thick is deposited via CVD to provide a lower resistance contact. Specifically, tungsten silicide can be deposited at a temperature of approximately 360° C. and a pressure of approximately 200 mT, in a mixture of 500 sccm silane ($SiH_4$) and 50 sccm of tungsten hexaflouride ($WF_6$).

Poly-cap layer 515 of approximately 500 Å is then deposited by LPCVD over tungsten silicide layer 514. Poly-cap layer 515 prevents potential peeling or cracking of the underlying tungsten silicide 514. 1000 Å thick capping layer 516, for example, of silicon oxynitride (SiON) is then deposited over poly-cap layer 515 to provide an anti-reflective coating and to be a masking layer for subsequent etching.

Figure 15:
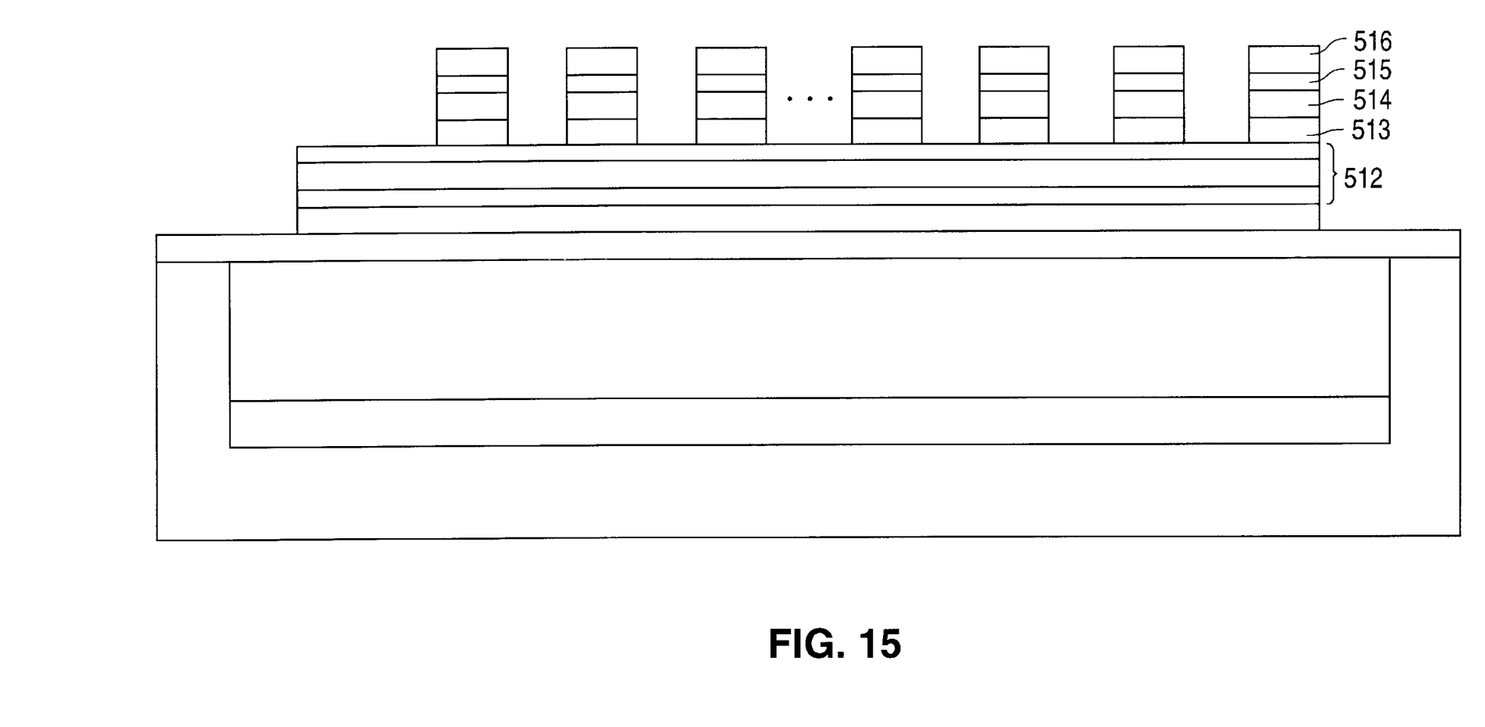

Referring to FIG. 15, suitable lithography and etching procedures are used to remove various portions of the device. After polysilicon layer 513, tungsten silicide layer 514, poly-cap layer 515 and capping layer 516 have been formed (word-lines for the memory cells can be defined in this manner) etching is performed to define one or more pre-stack structures. The etching (gate etch) may be achieved by depositing and defining a photoresist masking layer (gate mask, not shown) over the entire surface of the substrate using standard lithography procedures.

The gate mask and gate etch steps above can be performed as follows. First, a resist (not shown) is applied and patterned. Next, in one embodiment, the etching steps take place in a multi-chamber etch tool in which silicon oxynitride capping layer 516 is selectively etched with a fluorinated chemistry, such as $CHF_3$—$O_2$. The exposed portions of poly-cap layer 515 and tungsten silicide layer 514 are then etched with SF6/HBr (or alternatively, $SF_6$/$Cl_2$ or $Cl_2$—$O_2$) and the exposed portions of polysilicon layer 513 is etched with HBr—$O_2$.

Once polysilicon layer 513, tungsten silicide layer 514, poly-cap layer 515 and capping layer 516 have been removed, a self-aligned etch ("SAE") is performed to remove the dielectric layer 512 and the phosphorus-doped polysilicon layer 510 in the regions that are not covered by the pre-stack structure described above. The SAE etch is a two-step etch process in which dielectric layer 512 is first removed using, for example, a $CF_4$—$O_2$ RIE etch. The second phase of the SAE etch removes exposed portions of polysilicon layer 510 to further define the floating gate structures for each word-line using, for example, an HBr—$O_2$ or a HBr-$Cl_2$—$O_2$ RIE etch chemistry.

Figure 16:
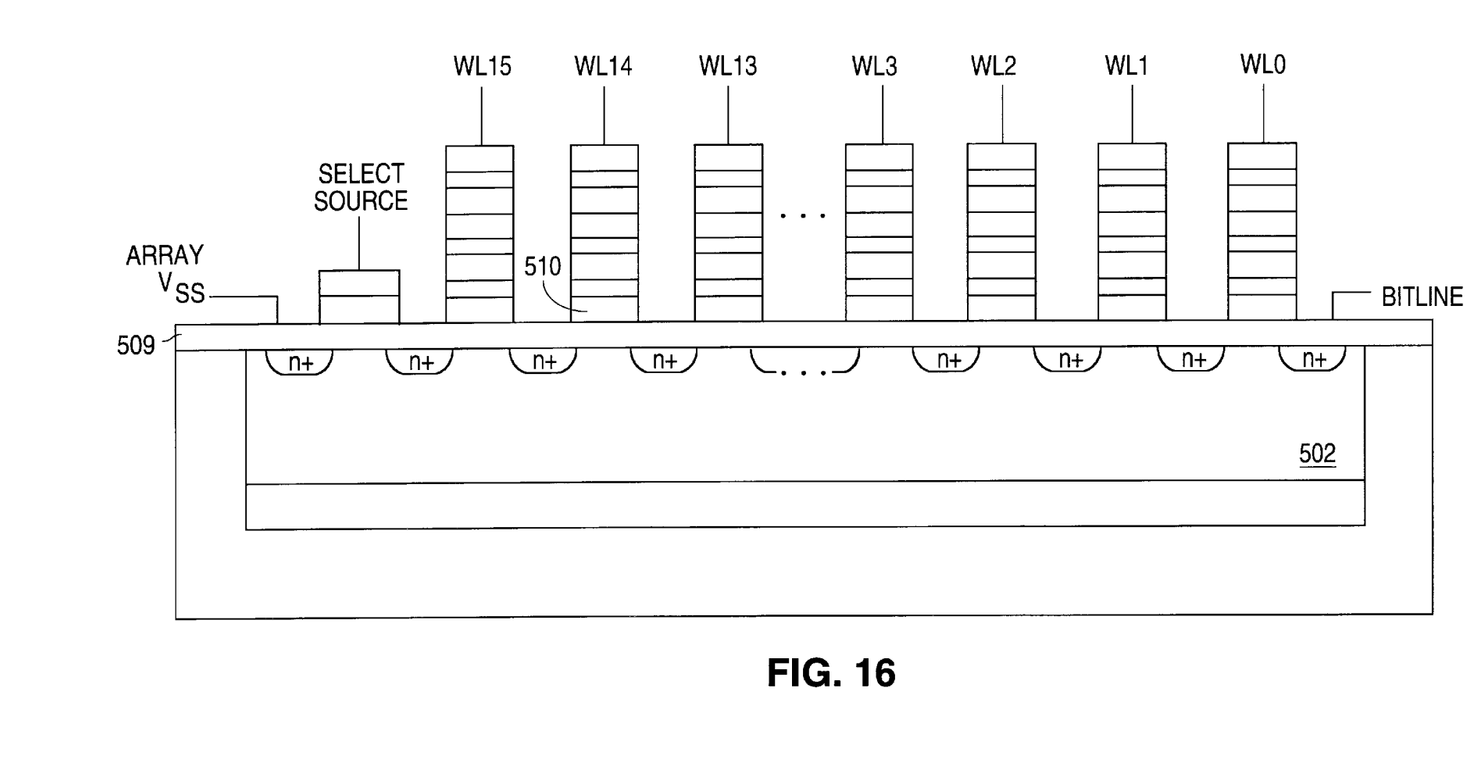

Select gate for select source transistor is formed by removing dielectric layer 512, second polysilicon layer 513, tungsten silicide layer 514, poly-cap layer 515 and cap layer 516. The remaining polysilicon layer 510 acts as the select gate for the select source transistor. The formation of the source and drain regions 517 and 518, respectively, is by, for example, ion implantation using suitable conventional methods. For example, the exposed portion of substrate 502 is doped at $1.0 \times 10^{14}$ atoms/$cm^3$ to form source and drain regions 517 and 518, respectively. For a NAND device, the dopant is, for example, phosphorous, implanted at an energy of approximately 60 KeV to a concentration of $1.0 \times 10^{14}$ atoms/$cm^3$. During formation of source and drain regions 517 and 518, the stacked gate structure serves as a self-aligning mechanism.

According to the present invention, N+ buried layer 504 improves the characteristic of the floating gate transistors by providing a forward-biased PN junction at the interface of P-well 507 and substrate 502. Consequently, "beta", which is in part dependent on the junction separation and depth, is enhanced.

The above detailed description is provided to illustrate the specific embodiments of the present invention and is not intended to be limiting. Numerous variations and modifications within the scope of the present invention are possible. The present invention is set forth in the following claims.

We claim:

1. A NAND array structure, comprising a plurality of memory cells connected in series between a bit-line and a select source transistor, said NAND array structure provided in a substrate having a buried layer extending beneath channel regions of said memory cells and said select source transistor, wherein said channel regions are of a first conductivity type and said buried layer is of a second conductivity type different from said first conductivity type.

2. The structure of claim 1, wherein said memory cells are floating gate transistors.

3. The structure of claim 2, wherein each memory cells comprises a control gate connected to a word-line.

4. The structure of claim 1, wherein said substrate includes a well region in which said memory cells are formed.

5. The structure of claim 4, wherein said buried layer is of N type.

6. A method for programming a memory cell in a NAND array structure in which wherein said memory cell is one in a plurality of memory cells coupled in series between a bit-line and a select source transistor, each memory cell having a control gate coupled to a word line, said method comprising:

rendering conducting said select source transistor, such that said memory cells are electrically connected to an array voltage source;

applying a first voltage to said bit-line;

applying a second voltage at a selected word-line; and applying a third voltage at an un-selected word-line, wherein the difference between said third voltage and said second voltage is less than a voltage necessary to achieve Fowler-Nordheim tunneling.

7. The method of claim 6, wherein said first voltage is between 4 volts and 5 volts.

8. The method of claim 7, wherein said array voltage source is ground.

9. The method of claim 6, wherein said second voltage between 6 volts and 10 volts.

10. The method of claim 6, wherein said third voltage is between 0 volt and 2 volts.

11. The method of claim 6, wherein said second and third voltages differ by more than a threshold voltage of selected memory cell.

12. The method of claim 11, wherein said threshold is between 2 volts and 3 volts.

13. The method of claim 6, further comprising programming a plurality of memory cells in said NAND array structure simultaneously.

14. The structure of claim 1, wherein said buried layer extends continuously extending beneath said channel regions of said memory cells and said select source transistor.

* * * * *